United States Patent
Watanabe et al.

(10) Patent No.: US 7,116,319 B2
(45) Date of Patent: Oct. 3, 2006

(54) IMAGE FORMING APPARATUS AND RADIATION DETECTION SYSTEM

(75) Inventors: Minoru Watanabe, Saitama (JP); Chiori Mochizuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 316 days.

(21) Appl. No.: 10/440,229

(22) Filed: May 19, 2003

(65) Prior Publication Data
US 2003/0218589 A1   Nov. 27, 2003

(30) Foreign Application Priority Data
May 21, 2002   (JP)   ............................. 2002-146287

(51) Int. Cl.
*G09G 5/00*   (2006.01)
(52) U.S. Cl. ........................................ 345/204; 345/92
(58) Field of Classification Search ................ 345/204, 345/205, 87, 90, 92, 100
See application file for complete search history.

(56) References Cited

U.S. PATENT DOCUMENTS

| | | | |
|---|---|---|---|
| 5,247,289 A * | 9/1993 | Matsueda | 345/98 |
| 5,351,145 A * | 9/1994 | Miyata et al. | 349/48 |
| 5,896,173 A | 4/1999 | Hassler | 348/162 |
| 5,936,223 A | 8/1999 | Suzuki et al. | 235/462.01 |
| 6,115,017 A * | 9/2000 | Mikami et al. | 345/92 |
| 6,162,986 A | 12/2000 | Shiotsuka et al. | 136/244 |
| 6,295,142 B1 * | 9/2001 | Watanabe et al. | 358/482 |
| 6,724,012 B1 * | 4/2004 | Kimura | 257/72 |
| 6,724,359 B1 * | 4/2004 | Yamamoto et al. | 345/92 |
| 2004/0189567 A1 * | 9/2004 | Kimura | 345/87 |

FOREIGN PATENT DOCUMENTS

| | | |
|---|---|---|
| JP | 5-91419 | 4/1993 |
| JP | 7-72258 | 3/1995 |
| JP | 7-322141 | 12/1995 |
| JP | 2000-59696 | 2/2000 |

* cited by examiner

*Primary Examiner*—Richard Hjerpe
*Assistant Examiner*—Jean Lesperance
(74) *Attorney, Agent, or Firm*—Fitzpatrick, Cella, Harper & Scinto

(57) ABSTRACT

An image forming apparatus is provided, which enables various kinds of drive in accordance with purposes. The image forming apparatus includes photoelectric conversion elements and TFT units which are arranged in a matrix shape, a signal processing circuit unit (for processing a signal from each photoelectric conversion element, and a gate driver circuit unit for controlling connections among the photoelectric conversion elements. The gate driver circuit unit is connected to the TFT units through gate lines. The gate lines include one that is connected to the TFT units in each row, and the gate lines include one that is connected to the TFT units in plural rows.

9 Claims, 6 Drawing Sheets

SECTIONAL VIEW

SECTIONAL VIEW

IMAGE FORMING APPARATUS AND RADIATION DETECTION SYSTEM

BACKGROUND OF THE INVENTION

1. Field of the Invention

The present invention relates to an image forming apparatus and a radiation detection system, and particularly to an image forming apparatus including a liquid crystal panel and a photoelectric conversion apparatus, and a radiation detection apparatus and a radiation detection system for detecting radiation containing X-ray, α-ray, β-ray, and γ-ray.

2. Related Background Art

In recent years, rapid progresses are being made in increasing the size of a panel using a TFT and increasing the drive speed. Those circumstances have been affected by the development in techniques for manufacturing a liquid crystal panel using a TFT and by the application of an X-ray image pickup apparatus having a photoelectric conversion element and the like to each field of area sensors.

Also, concurrently with the increase in panel size, progresses in finer pixel pitches and finer wiring widths have caused a tendency to increase the wiring resistance of each unit. In a liquid crystal panel, the finer pixel pitches cause reduction in the pixel aperture ratio, thereby reducing the amount of light from a backlight. Thus, it is difficult to provide a liquid crystal panel having a high brightness.

Also, the increases in panel size have caused increases in wiring pattern length, and the finer wiring patterns have caused increases in wiring resistance, thereby increasing the time constant and reducing the drive speed for a TFT.

Similarly, in the X-ray image pickup apparatus, the reduction in the pixel aperture ratio causes reduction in the area of a sensor light receiving unit, thereby reducing the sensitivity of a sensor. Also, if the drive speed of a TFT is reduced, there is a case where the sensor cannot be used as a dynamic image sensor, thereby limiting the application of the sensor.

FIG. 8 shows an equivalent circuit for a matrix panel using a conventional TFT. Here, an example will be described of the matrix panel applied to a photoelectric conversion apparatus or a radiation detection apparatus.

Each pixel shown in FIG. 8 is composed of a pair of a thin film transistor unit (TFT unit) 12 and a photoelectric conversion element unit 11.

The photoelectric conversion element unit 11 generates electrons and holes when absorbing light, and accumulates the electrons or the holes in a capacitor that is provided to the inside thereof.

Then, by driving a gate driver circuit unit 17, an on voltage for turning on the TFT unit 12 is applied to gate lines 13 to drive the TFT units 12. Thus, the electrons or the holes accumulated in the capacitor are transferred directly or indirectly through the TFT units 12 from data lines 14 to a signal processing circuit unit 15 to display an image.

At this time, in the case of the photoelectric conversion element unit 11 of a metal-insulator-semiconductor (MIS) type, an operation is necessary of applying a forward bias from a common electrode driver circuit unit 16 to a common electrode wiring 10 to remove the electrons or the holes accumulated in an insulating film interface.

Alternatively, if a phosphor layer for converting radiation into visible light is arranged on an upper portion of the matrix panel, or if amorphous selenium, lead iodide, or mercury iodide which generates electrons and holes directly from radiation is used as a photoelectric conversion element, a radiation detection apparatus can be obtained.

For a liquid crystal panel, the photoelectric conversion element unit 11 is replaced by a liquid crystal capacitor unit 18.

The example described above presents the following problem.

That is, a demand on the photoelectric conversion apparatus or the like when the TFT unit 12 is driven at a high speed is different from a demand thereon when the TFT unit 12 is driven at a slow speed, and it is difficult to meet the two demands simultaneously.

When driven at a high speed, the speed of response is given a higher priority. That is, it is a higher priority to remove artifacts with respect to a display/take-in image due to an after-image in both the liquid crystal display panel and the photoelectric conversion element panel which is generated when the speed of response is reduced.

On the other hand, when the TFT unit 12 is driven at a slow speed, a higher priority is given to displaying or taking in of an image having a high definition and a high contrast than the speed of response.

Up to now, in order to execute individual photography, it is publicly known to use films having various resolutions, for example, a combination of films/sheets or storage sheets. An example using them is an X-ray image amplifier having a low lateral resolution and a magnification power that can be switched over for the purpose of transmission irradiation. Also, an X-ray diagnostic apparatus for performing a selection operation between a high-frame mode and a high-definition mode is publicly known.

SUMMARY OF THE INVENTION

In view of the above, an object of the present invention is to make it possible, with a simple structure of a matrix panel, to realize high-speed drive and to obtain a high-definition image according to objects.

In order to solve the above problem, according to the present invention, there is provided an image forming apparatus, including:

pixels that are arranged in a matrix shape;

a signal processing circuit unit for processing a signal from each of the pixels and sending a signal to each of the pixels; and a driver circuit unit for controlling connections among the pixels, in which:

the driver circuit unit is connected to the pixels through at least two control wirings; and the control wirings include a control wiring in which the pixels in one of each row and each column are connected to each other, and a control wiring in which the pixels in ones of plural rows or plural columns are connected to each other in common.

Further, there is provided a radiation detection apparatus, including:

plural pixels that are arranged in a matrix shape and each include a conversion element for converting radiation into an electric signal and a switching element;

a signal processing circuit unit for processing a signal from each of the conversion elements; and a driver circuit unit for controlling continuity of the switching element, in which:

each of the pixels includes at least two signal transfer switching elements;

a gate electrode of a first switching element is connected to a first gate line group in which only pixels arranged in the same row are connected to each other in common; and a gate electrode of a second switching element is connected to a second gate line group in which pixels arranged in plural rows are connected to each other in common.

DESCRIPTION OF THE PREFERRED EMBODIMENTS

Hereinafter, a description will be made of embodiments of the present invention based on the drawings.

Embodiment 1

Figure 1:
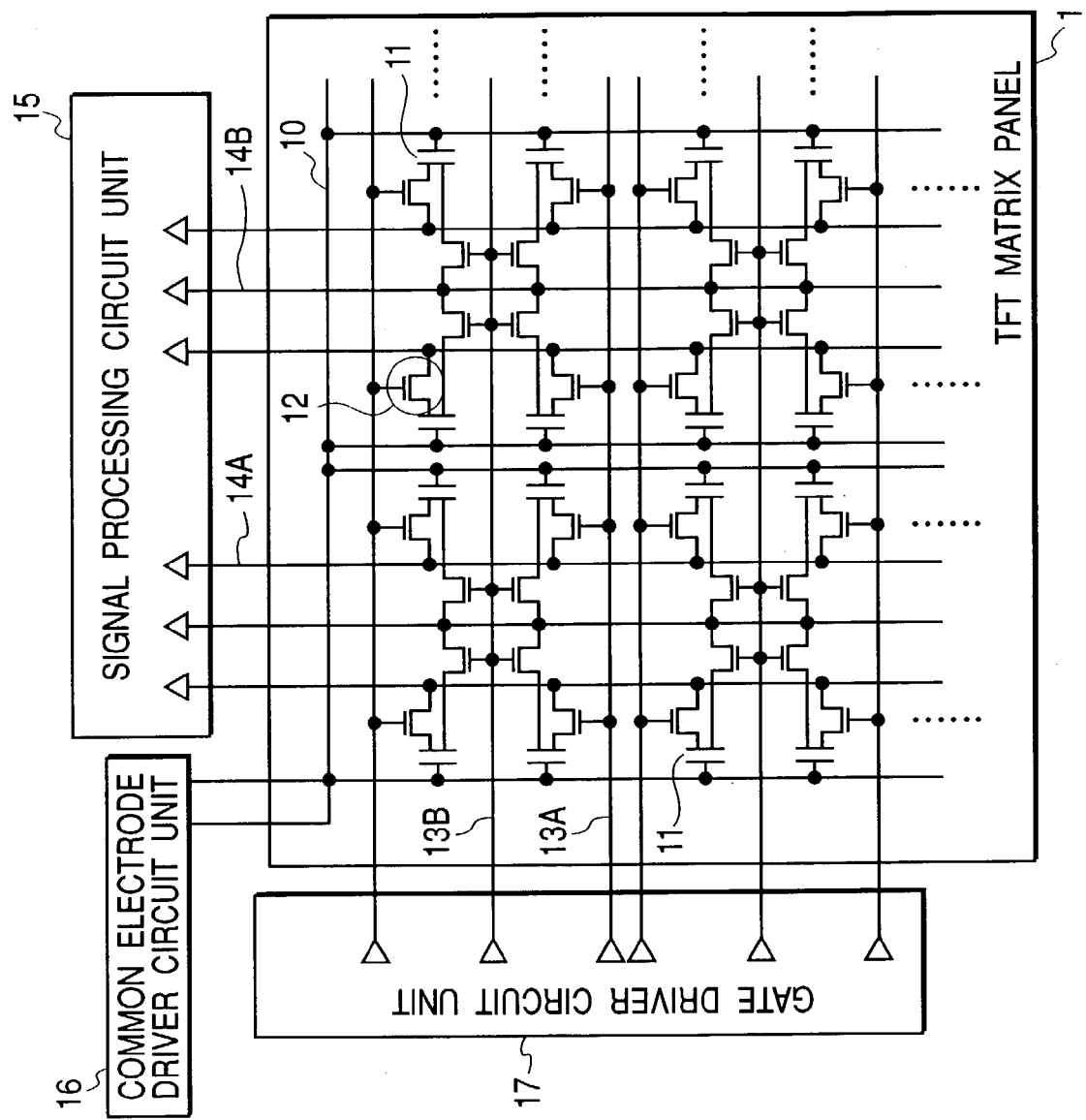
FIG. 1 shows an equivalent circuit for a TFT matrix panel provided to a radiation detection apparatus according to Embodiment 1 of the present invention.

FIG. 1 shows an equivalent circuit for a TFT matrix panel provided to a radiation detection apparatus according to Embodiment 1 of the present invention.

A TFT matrix panel 1 shown in FIG. 1 uses a bias applied from a gate driver circuit unit 17 to a first gate line group 13A and/or a second gate line group 13 to drive TFT units 12 arranged in a matrix shape. Then, a signal from each of photoelectric conversion element units 11 is transferred through the corresponding TFT unit 12 from a first data line group 14A and/or a second data line group 14B to a signal processing circuit unit 15, so that image information is read out. As the structure of a photoelectric conversion element, a metal-insulator-semiconductor (MIS) structure including a capacitance in the inside thereof can be used.

Here, the photoelectric conversion element unit 11 includes a capacitor and generates carriers of electrons and holes from light taken in from the outside. Then, the carriers can be read out by the TFT unit 12.

Alternatively, by arranging a phosphor layer for converting radiation into visible light on the matrix panel 1, or by using amorphous selenium, $PbI_2$, $HgI_2$, or the like, as a material of the photoelectric conversion element, which directly absorbs radiation and generates electrons and holes, a radiation detection flat panel sensor can be obtained.

In the TFT matrix panel 1, the gate driver circuit unit 17 has a system A corresponding to the first gate line group and a system B corresponding to the second gate line group which are separately provided therein such that the respective systems can be independently driven. Similarly, the signal processing circuit unit 15 has a system A corresponding to the first data line group and a system B corresponding to the second data line group which are separately provided therein so that signals can be outputted from the respective systems independently.

The system A and the system B of the gate driver circuit unit 17 corresponds to the system A and the system B of the signal processing circuit unit 15, respectively. In the case where the system A of the gate driver circuit unit 17 is driven to apply an on voltage for the TFT unit 12 to the gate lines 13A of the system A, accumulated carriers are transferred to the signal processing circuit unit 15 through the data lines 14A controlled by the system A.

In contrast, in the case where the system B of the gate driver circuit unit 17 is driven to apply the on voltage for the TFT unit 12 to the gate lines 13B of the system B, carriers accumulated in the capacitors are transferred to the signal processing circuit unit 15 through the data lines 14B controlled by the system B.

The system A of the gate driver circuit unit 17 applies the on voltage for the TFT unit 12 to the gate lines 13A to drive the TFT units 12 in each row. Thus, the carriers are read out through the data lines 14A.

In contrast, the system B applies the on voltage for the TFT unit 12 to the gate lines 13B to drive the TFT units 12, for example, in two adjacent rows. Thus, the carriers are read out through the data lines 14B.

In the case where drive is performed by the system A in a panel having m×n photoelectric conversion element units 11 within the TFT matrix panel 1 having the gate lines 13A arranged in the row direction and the data lines 14A arranged in the column direction, in order to obtain one image, m gate lines 13A are driven and the carriers are transferred to n data lines 14A. That is, in the system A, only the pixels belonging to the same row are connected to each gate line.

On the contrary, in the case where the drive is performed by the system B in the same panel as above, in order to obtain one image, m/2 gate lines are driven and the carriers are transferred to n/2 data lines 14B. That is, in the system B, the pixels arranged in plural rows are connected in common to each gate line.

Therefore, compared with the system A, the system B uses only half of the gate lines to drive, thereby making it possible to read out the carriers in approximately half the time.

In other words, according to the structure of this embodiment, one pixel includes one photoelectric conversion element and two switching elements. One of the switching elements is connected to the gate line that connects in common only the pixels belonging to the same row (system A). The other switching element is connected to the gate line that connects in common the pixels arranged in plural rows (system B).

Therefore, if the drive is performed in the system A, an image composed of the normal number of pixels is outputted, and if performed in the system B, an image in which four pixels are processed as one pixel is outputted. Accordingly, it becomes possible to perform the drive depending on the cases to obtain an image 1 having a long readout time and a high definition or an image 2 having a shorter readout time and a lower definition than the image 1.

In the case of using the photoelectric conversion element unit 11 of the MIS type, after reading out the carriers as described above, a bias is applied from a common electrode driver circuit unit 16 to a common electrode wiring 10 to perform a refresh drive for removing the electrons or the holes accumulated in an insulating film interface.

Figure 2:
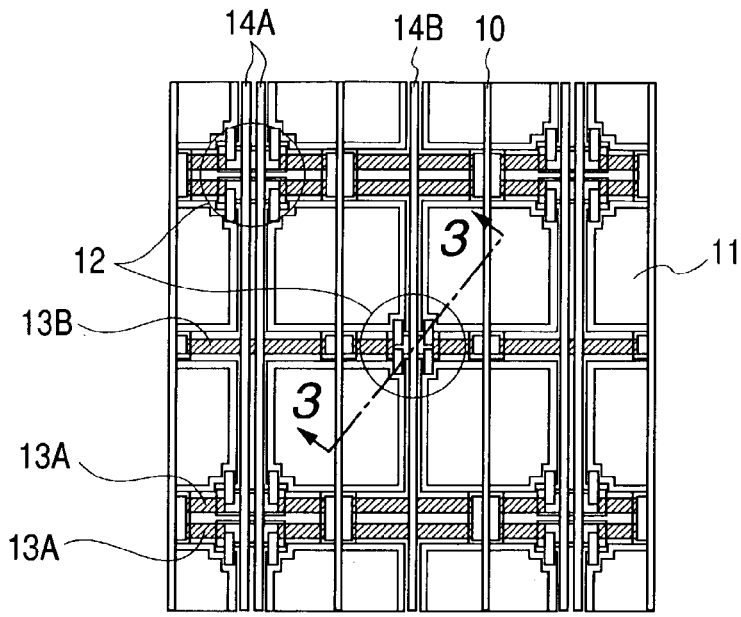
FIG. 2 is a plan view schematically showing a part of a photoelectric conversion element unit 11 shown in FIG. 1.

FIG. 2 is a plan view schematically showing a part of the photoelectric conversion element unit 11 shown in FIG. 1. Here, each pixel composed of the photoelectric conversion element unit 11 and the TFT unit 12 is formed into a square so as to have a pixel pitch of approximately 100 to 200 μm both vertically and horizontally.

In the system A, signals can be read out from the respective pixels in each row. In the system B, signals can be simultaneously read out from four pixels in two rows.

In other words, by reading out the signals in the system A, it is possible to take in a high-definition image having a resolution of 100 to 200 μm being the pixel pitch.

Also, by reading out the signals in the system B, a high-sensitivity sensor having a resolution of 200 to 400 μm which is double the pixel pitch can be realized. At the same time, both a processing time by the gate driver circuit unit 17 to drive and a processing time by the signal processing circuit unit 15 are approximately half of those in the system A, thereby enabling high-speed drive compared with the system A.

Figure 3:
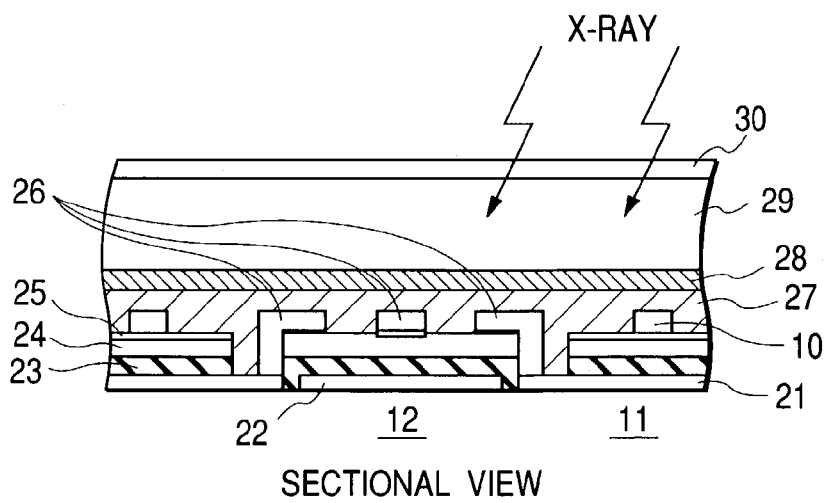
FIG. 3 is a sectional view taken along the line 3—3 in FIG. 2.

FIG. 3 is a sectional view taken along the line 3—3 in FIG. 2. Here, a phosphor for converting radiation into visible light is also shown therein.

The TFT unit 12 includes a gate electrode 22, a gate insulating film 23, a semiconductor layer 24, an n-type semiconductor layer 25, and a source/drain electrode 26.

The photoelectric conversion element unit 11 has the same structure as the TFT unit 12. Each film of the photoelectric conversion element unit 11 is formed at the same time of the film forming process when forming the TFT unit 12.

The gate electrode 22 and a lower electrode 21 composes a two-layer structure of an Al—Nd film and a Mo film. The Al—Nd film is first formed by sputtering to have a thickness of approximately 30 to 400 nm. Then, while maintaining vacuum, the Mo film is formed thereon by sputtering as well to have a thickness of approximately 15 to 70 nm.

The gate insulating film 23, the semiconductor layer 24, and the n-type semiconductor layer 25 are formed by CVD. A silicon nitride film as the gate insulating film 23, the semiconductor layer 24, and the n-type semiconductor layer 25 are continuously formed without breaking vacuum to have film thicknesses of approximately 150 to 400 nm, approximately 300 to 1000 nm, and approximately 10 to 100 nm, respectively.

The source/drain electrode 26 and the common electrode wiring 10 are each formed of aluminum by sputtering to have a film thickness of approximately 200 to 2000 nm.

After forming the TFT unit 12 and the photoelectric conversion element unit 11, a silicon nitride protective film serving as an insulating protective film is formed thereon by CVD to have a thickness of approximately 200 to 1500 nm. In addition, a polyimide film 28 is formed thereon by spin coating to have a thickness of approximately 1 to 10 μm.

Arranged in the further upper portion is a phosphor layer for converting radiation into visible light, in particular, a gadolinium oxysulphide phosphor (GOS) film in this embodiment. Lastly, a reflective film 30 is formed of aluminum serving both as a reflective layer and to protect the panel.

Figure 4:
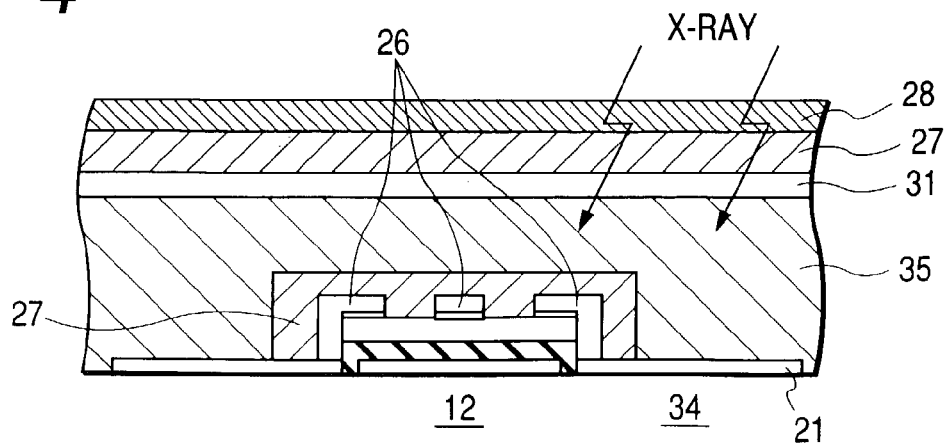
FIG. 4 is a sectional view showing the vicinity of the photoelectric conversion element unit 11 provided to the radiation detection apparatus that uses amorphous selenium 35 for directly converting radiation into an electric signal.

Alternatively, instead of the structure as shown in FIG. 3, a layer structure as shown in FIG. 4 may be adopted as follows.

FIG. 4 is a sectional view showing the vicinity of the photoelectric conversion element unit 11 and the TFT unit 12 provided to the radiation detection apparatus that uses amorphous selenium 35 for converting radiation into an electric signal.

In that case, the phosphor layer for converting radiation into a visible light as shown in FIG. 3 is not used, thereby enabling simplification of the manufacturing process. More specifically, after forming the TFT unit 12, the amorphous selenium 35 is deposited by vacuum evaporation. After that, ITO 31 is formed into a film serving as a common electrode, and the silicon nitride protective film and the polyimide film are formed thereon in order.

An amorphous capacitor unit sandwiched between the ITO 31 and the lower electrode 21 functions as the photoelectric conversion element unit 11 to directly generate electrons and holes. Note that instead of the amorphous selenium 35, lead iodide or mercury iodide may be used. Also, instead of the ITO 31, a metal thin film having a low specific resistance, for example, an aluminum film having a thickness of approximately 100 to 1000 nm may be employed.

Photolithography is used for patterning of each film and wet etching is used for etching of the metal films such as the Al—Nd film, the Mo film, and the aluminum film. However, dry etching may be used particularly for the Mo film and the aluminum film.

Dry etching is used for etching of the silicon-based gate insulating film 23, the semiconductor layer 24, the n-type semiconductor layer 25, and the silicon nitride protective film 27.

Embodiment 2

Figure 5:
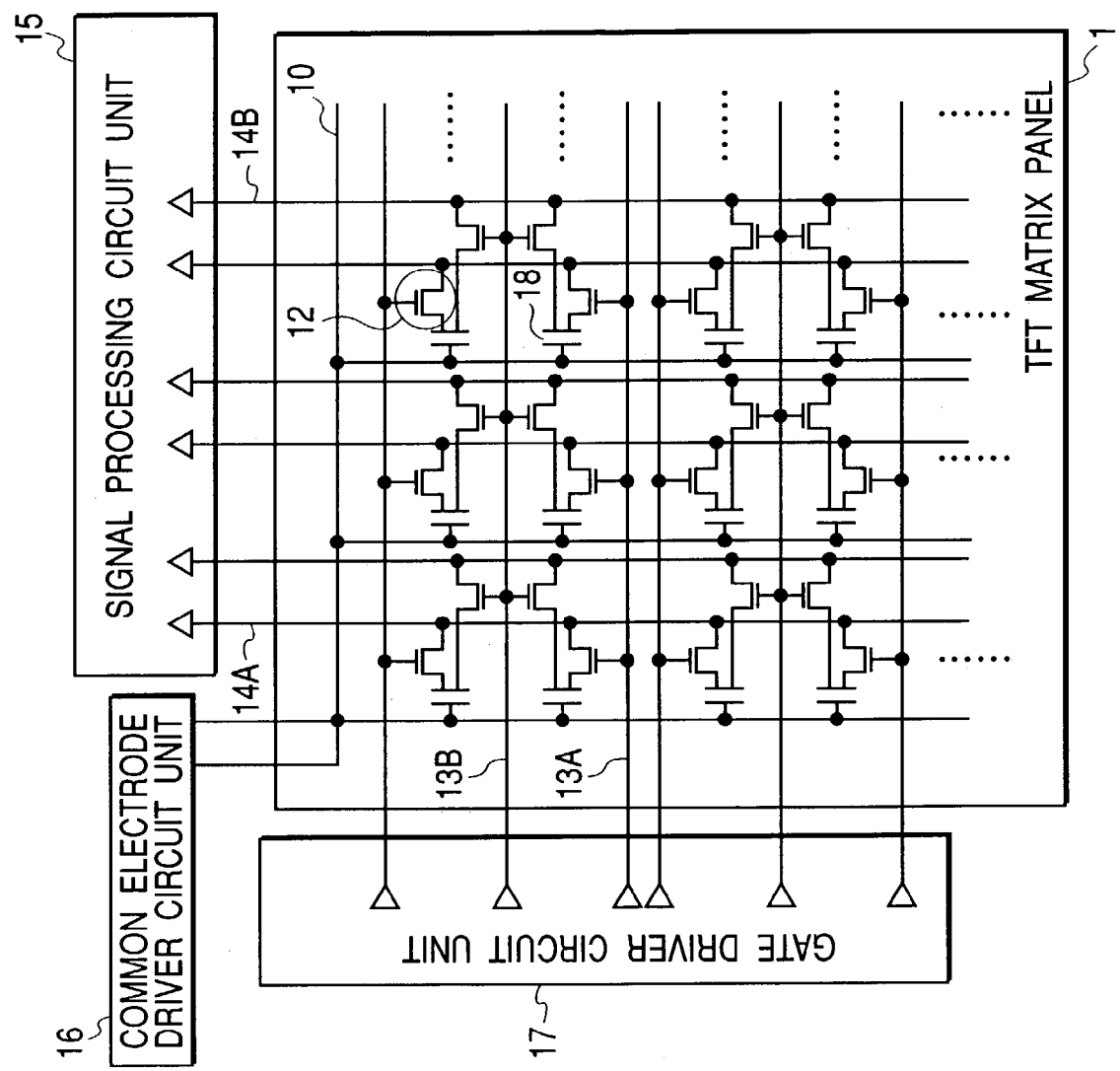
FIG. 5 shows an equivalent circuit for a TFT matrix panel provided to a liquid crystal display device according to Embodiment 2 of the present invention.

FIG. 5 shows an equivalent circuit for a TFT matrix panel provided to a liquid crystal display device according to Embodiment 2 of the present invention.

By using a bias applied from the gate driver circuit unit 17 to the plural gate lines 13A, 13B, TFT units 12 arranged in a matrix shape are driven.

Thus, signals sent from the signal processing circuit unit 15 are transferred through the plural data lines 14A, 14B, and a voltage is applied to a liquid crystal capacitor unit 18 corresponding to each TFT unit 12, so that an orientation direction of liquid crystal is changed to control liquid crystal display.

Note that the adjacent data lines 14A, 14B may be made common so as to apply a voltage to each liquid crystal capacitor unit 18.

In the TFT matrix panel 1, the gate driver circuit unit 17 has the system A and the system B which are separately provided therein, so that the respective systems can be independently driven. Similarly, the signal processing circuit unit 15 has the system A and the system B which are separately provided therein, so that signals can be outputted from the respective systems independently.

The system A and the system B of the gate driver circuit unit 17 corresponds to the system A and the system B of the signal processing circuit unit 15, respectively. In the case where the system A of the gate driver circuit unit 17 is driven to apply an on voltage for the TFT unit 12 to the gate lines 13A of the system A, signals from the system A in the signal processing circuit unit 15 can be transferred to the liquid crystal capacitor unit 18 through the data lines 14A.

In contrast, in the case where the system B of the gate driver circuit unit 17 is driven to apply the on voltage for the TFT unit 12 to the gate lines 13B of the system B, signals from the system B in the signal processing circuit unit 15 can be transferred to the liquid crystal capacitor unit 18 through the data lines 14B.

When the system A of the gate driver circuit unit 17 applies the on voltage for the TFT unit 12 to one gate line 13A, the TFT unit 12 is driven for connecting one source electrode connected to the capacitor and one drain electrode connected to one data line 14A for transferring a signal from the system A of the signal processing circuit unit 15.

In contrast, when the system B of the gate driver circuit unit 17 applies the on voltage for the TFT unit 12 to one gate line 13B, the TFT unit 12 is driven for connecting two source electrodes connected to the capacitor and two drain electrodes connected to one data line 14B for transferring a signal from the system B of the signal processing circuit unit 15. That is, a common voltage can be applied to the pixels arranged in plural rows.

In the case where drive is performed by the system in a panel composed of m×n liquid crystal capacitor units 18 within the TFT matrix panel 1 having the gate lines 13A arranged in the row direction and the data lines 14A arranged in the column direction, in order to display one image, m gate lines 13A and n data lines 14A are driven.

In contrast, in the case where the drive is performed by the system B in the same panel as above, m/2 gate lines 13B and the n/2 data lines 14B are driven.

Accordingly, in the system B, the gate driver circuit unit 17 can be driven in approximately half the time of the case in the system A. Similarly, a process by the signal processing circuit unit 15 can be performed in approximately half the time.

Figure 6:
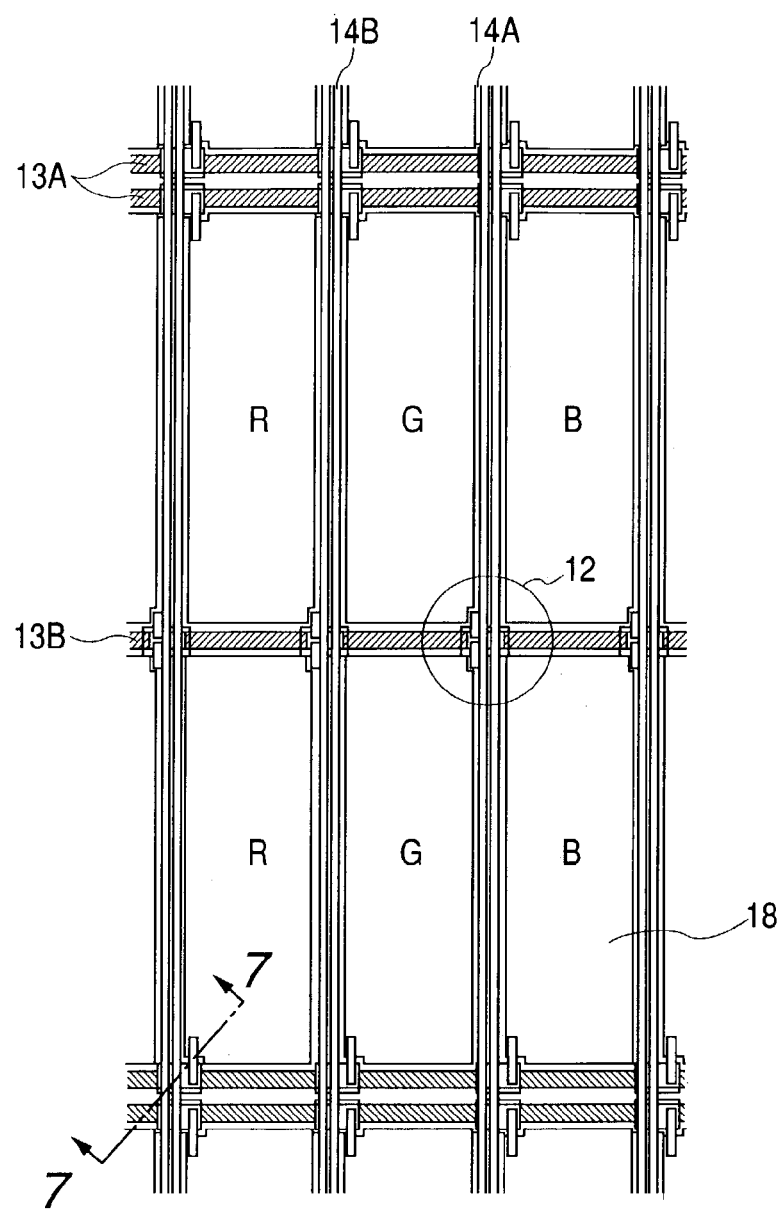
FIG. 6 is a plan view showing a part of the liquid crystal display device including the TFT matrix panel shown in FIG. 5.

FIG. 6 is a plan view showing a part of the liquid crystal display device including the TFT matrix panel shown in FIG. 5. Each pixel including the liquid crystal capacitor unit 18 is formed into a rectangle so as to have a pixel pitch of approximately 100 to 500 μm vertically and ⅓ thereof, that is, approximately 30 to 170 μm, horizontally.

Each liquid crystal capacitor unit 18 is composed of a liquid crystal capacitor and a memory storage capacitor. Also, liquid crystal and color filters are arranged on each capacitor, and red (R), green (G), and blue (B) filters are arranged in order in the horizontal direction.

By driving the system A, the signals from the signal processing circuit unit 15 can be independently transferred to the respective liquid crystal capacitor units 18. By driving the system B, the signals can be simultaneously transferred to two liquid crystal capacitor units 18 arranged in vertical positions and having the same color filter thereon.

Thus, in the liquid crystal display panel, by transferring the signals in the system A, it is possible to taken in a high-definition image having a resolution of 100 to 500 μm which is the pixel pitch.

Also, in the liquid crystal display panel, by reading out the signals in the system B, while maintaining the horizontal resolution, the vertical resolution becomes 200 to 1000 μm which is double the pixel pitch. Therefore, the processing time by the gate driver circuit unit 17 becomes approximately half, thereby enabling high-speed drive.

As a result, the liquid crystal display device of this embodiment includes a resolution priority mode, in particular, a mode for a personal computer display or high-quality still image display device, and a high-speed priority mode, in particular, a mode for a moving picture image display used for a household television set.

Also, regarding the above pixel pitch, it is described that the horizontal pixel pitch is approximately ⅓ of the vertical pixel pitch. However, to the contrary, the vertical pixel pitch may be approximately ⅓ of the horizontal pixel pitch. Alternatively, the ratio of the vertical pixel pitch to the horizontal pixel pitch may be 3:2 or 2:3, and may also be 1:1 when driving two adjacent pixels having the same color simultaneously by the system B.

Figure 7:
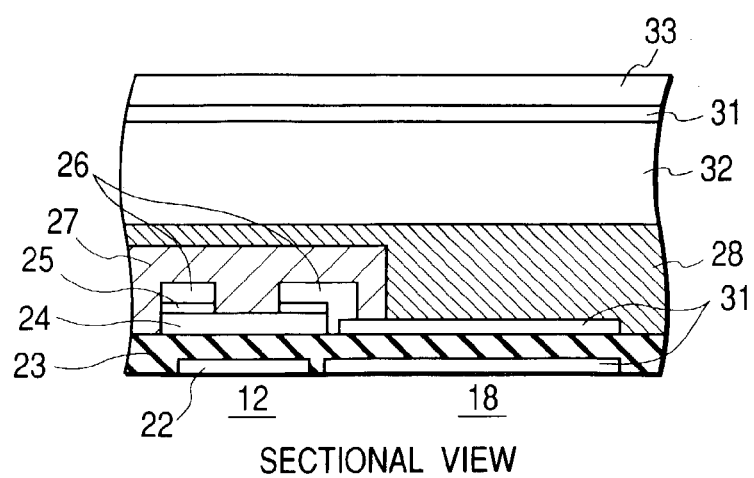
FIG. 7 is a sectional view taken along the line 7—7 in FIG. 6.
Figure 8:
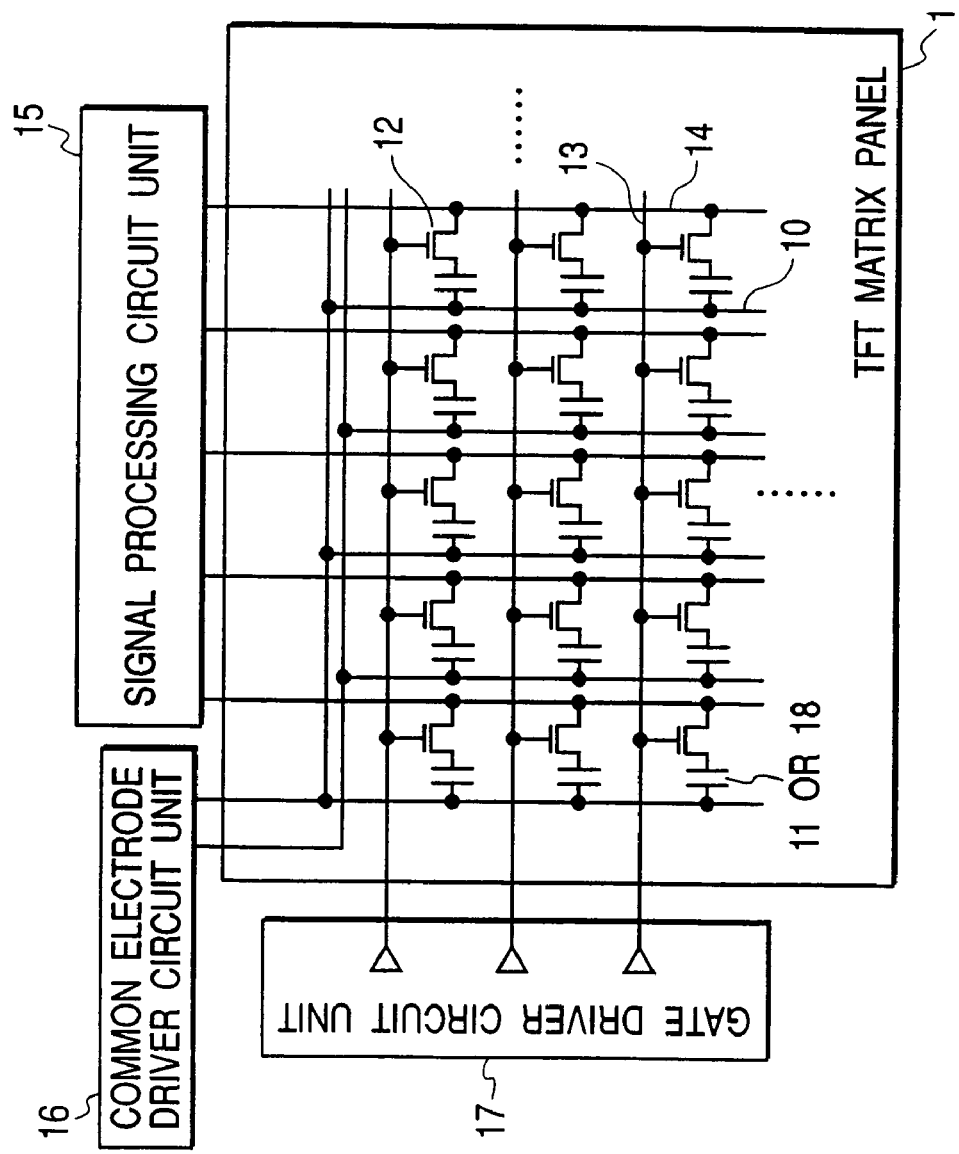
FIG. 8 shows an equivalent circuit for a matrix panel using a conventional TFT.

FIG. 7 is a sectional view taken along the line 7—7 in FIG. 6. The TFT unit 12 is formed of the gate electrode 22, the gate insulating film 23, the semiconductor layer 24, the n-type semiconductor layer 25, and the source/drain electrode 26.

Also, the upper portion and the lower portion of the capacitor unit 18 are formed of ITO. As the insulating film therebetween, the gate insulating film formed when forming the TFT unit 12 is used.

The gate electrode 22 is formed of chromium by sputtering to have a film thickness of approximately 30 to 250 nm.

The gate insulating film 23, the semiconductor layer 24, and the n-type semiconductor layer 25 are formed by CVD. A silicon nitride film as the gate insulating film 23, the semiconductor layer 24, and the n-type semiconductor layer 25 are continuously formed without breaking vacuum to have film thicknesses of approximately 150 to 400 nm, approximately 50 to 200 nm, and approximately 10 to 100 nm, respectively.

The source/drain electrode 26 is formed of aluminum by sputtering to have a film thickness of approximately 200 to 2000 nm.

The silicon nitride protective film 27 serving as an insulating protective film is formed on the TFT unit 12 by CVD to have a thickness of approximately 200 to 1000 nm. In addition, a polyimide film 28 is formed thereon by spin coating to have a thickness of approximately 1 to 10 μm.

Liquid crystal 32 is arranged in the further upper portion and the ITO 31 serving as an electrode and upper glass 33 are arranged thereon.

Photolithography is used for patterning of each film and wet etching is used for etching of metal films such as the chromium film and the aluminum film. However, dry etching may be used therefor.

Dry etching is used for etching of the silicon-based gate insulating film 23, the semiconductor layer 24, the n-type semiconductor layer 25, and the silicon nitride protective film 27.

Note that in each embodiment of the present invention, the case of arranging the pixels in a matrix shape is exemplified. However, the pixels may be arranged in a delta shape or a honeycomb shape. Also, the TFT units 12 may be replaced by other transistors.

Further, in each embodiment, the case of providing the gate line 13B for connecting the pixels in two adjacent rows is exemplified. However, in the case of performing readout of the electric signal or the like at a higher speed, the gate line 13B may be provided for connecting the pixels arranged in three rows.

Further, the structure as shown in FIG. 5 described in Embodiment 2 can be applied to the photoelectric conversion apparatus or the radiation detection apparatus. That is, while four pixels in the system A are read out as one pixel by the system B in Embodiment 1, two pixels in the system A may be read out as one pixel.

Embodiment 3

Figure 9:
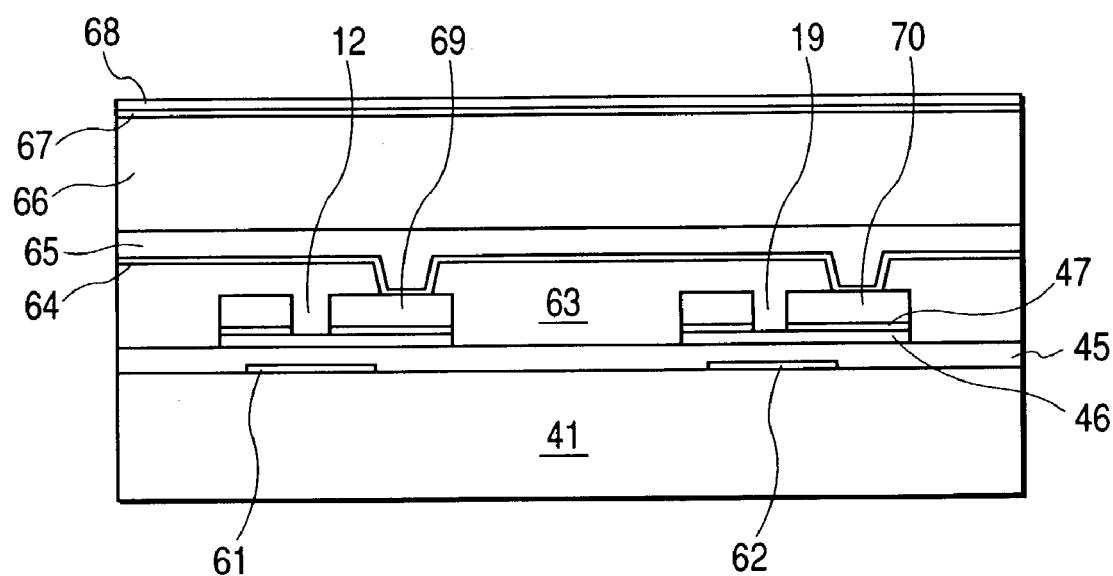
FIG. 9 shows a sectional view of an apparatus according to Embodiment 3.

This embodiment is described in relation to forming a structure provided with a photoelectric conversion unit on a switching element in the photoelectric conversion apparatus or the radiation detection apparatus. In FIG. 3 of Embodiment 1, the photoelectric conversion element and the switching element are arranged within the same plane. On the other hand, in this embodiment, by providing the photoelectric conversion unit on the switching element, further an improved aperture ratio can be realized. FIG. 9 is a sectional view thereof. FIG. 1 or FIG. 5 can be used as the equivalent circuit diagram.

In FIG. 9, reference numeral 41 denotes an insulating substrate such as glass, 12 a switching element A belonging to the system A described in the above embodiments, and 19 a switching element B belonging to the system B. Reference numeral 61 denotes a gate electrode of the switching element A, 62 a gate electrode of the switching element B, 45 a gate insulating film, 46 a first semiconductor layer, 47 a first ohmic contact layer, 63 a leveling film, 64 a first electrode layer of the photoelectric conversion element, 65 an insulating layer, 66 a second semiconductor layer, 67 a second ohmic contact layer, 68 a second electrode layer, 69 a main electrode connected to the photoelectric conversion element of the switching element A, and 70 a main electrode connected to the photoelectric conversion element of the switching element B. Although not shown in FIG. 9, the main electrode 70 is further connected to the photoelectric conversion element of the adjacent pixel.

Wherein, the main electrode of the switching element A and the main electrode of the switching element B are connected to the same photoelectric conversion element. And, either one of the switching elements A and B is by itself capable of transferring a signal to a data line. The other of the switching elements is at a time of operation capable of transferring the signals from a plurality of pixels simultaneously to one data wiring.

According to the above structure, the photoelectric conversion element is formed by being laminated on the switching element, so that the aperture ratio can be improved and it is possible to simplify a drive circuit unit composed of the switching elements such as TFTs. In particular, in the case of using an MIS-type photoelectric conversion element as the photoelectric conversion element, after forming the leveling film 63, a contact hole is formed. Then, the first electrode layer contacts an electrode of the TFT. Accordingly, by using the leveling film, it is possible to make the insulating film of the MIS-type photoelectric conversion element thinner, so that the sensitivity of the element can be more preferably improved.

The present invention can also be effected by appropriately combining the embodiments described above. Further, the terms "row" and "column" are defined for illustration and can be interchangeably used.

What is claimed is:

1. An image forming apparatus, comprising:
    a plurality of pixels arranged in row and column directions, each of the pixels having at least two switching elements;
    a signal processing circuit unit for processing a signal from each of the pixels or for sending a signal to each of the pixels; and
    a driver circuit for driving the switching elements of each of the pixels, wherein the driver circuit unit is connected to first and second control wirings, and wherein the first control wiring is commonly connected to ones of the two switch elements of the pixels in the same row, and the second control wiring is commonly connected to the others of the two switching elements of the pixels of plural rows.

2. An image forming apparatus according to claim 1, wherein each pixel also includes a photoelectric conversion element, and an electric signal based on an optical signal converted by the photoelectric conversion element is sent to said signal processing circuit unit through one of said pixel switching elements.

3. An image forming apparatus according to claim 2, wherein a part of the photoelectric conversion element of each said pixel is formed and stacked on a said switching element of said pixel.

4. An image forming apparatus according to claim 2, wherein:
    each pixel has a liquid crystal element connected through a said switching element to said signal processing circuit unit;
    a said switching element is a thin film transistor;
    the first or second control wirings are connected to a gate electrode of said transistor;
    one of the photoelectric conversion element and the liquid crystal element is connected to one of a source electrode and a drain electrode of the transistor; and
    a data wiring connected to the signal processing circuit unit is connected to another of the drain electrode and the source electrode.

5. An image forming apparatus according to claim 1, wherein each pixel includes a liquid crystal element, and a said switching element for each pixel transmits a signal to be applied from the signal processing circuit unit to the liquid crystal element.

6. A radiation detection apparatus, comprising:
    an image forming apparatus of claim 1; and
    a phosphor arranged in a light incident surface side of the image forming apparatus.

7. A radiation detection apparatus, comprising:
    a plurality of pixels arranged in row and column directions, each pixel having at least two switching elements and a conversion element for converting radiation into an electric signal;
    a signal processing circuit unit for processing a signal from each of the conversion elements; and
    a driver circuit for controlling on and off of the switching elements, wherein the driver circuit is connected to first and second control wirings, and wherein the first control wiring is commonly connected to ones of the two switching elements connected in a same row, and the second control wiring is commonly connected to the others of the two switching elements of the pixels of plural rows.

8. A radiation detection apparatus according to claim 7, wherein a part of the conversion element is formed and stacked on the switching element.

9. A radiation detection apparatus according to claim 7, wherein a said switching element in each pixel is formed of a thin film transistor.

* * * * *

UNITED STATES PATENT AND TRADEMARK OFFICE
CERTIFICATE OF CORRECTION

PATENT NO. : 7,116,319 B2 Page 1 of 1
APPLICATION NO. : 10/440229
DATED : October 3, 2006
INVENTOR(S) : Minoru Watanabe et al.

It is certified that error appears in the above-identified patent and that said Letters Patent is hereby corrected as shown below:

COLUMN 2:
   Line 41, close up right margin; and
   Line 42, close up left margin.

COLUMN 4:
   Line 7, "corresponds" should read --correspond--.

COLUMN 6:
   Line 57, "corresponds" should read --correspond--.

COLUMN 7:
   Line 50, "taken" should read --take--.

COLUMN 9:
   Line 4, "further an" should read --a further--.

Signed and Sealed this

Fifth Day of June, 2007

JON W. DUDAS
*Director of the United States Patent and Trademark Office*